United States Patent
Lutz et al.

(10) Patent No.: US 7,675,173 B2
(45) Date of Patent: Mar. 9, 2010

(54) MANUFACTURING SEMICONDUCTOR CIRCUIT, CORRESPONDING SEMICONDUCTOR CIRCUIT, AND ASSOCIATED DESIGN PROCESS

(75) Inventors: Walther Lutz, Erding (DE); Erwin Ruderer, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 605 days.

(21) Appl. No.: 11/583,762

(22) Filed: Oct. 18, 2006

(65) Prior Publication Data

US 2007/0096216 A1      May 3, 2007

(30) Foreign Application Priority Data

Oct. 18, 2005   (DE) ............... 10 2005 049 793

(51) Int. Cl.
*H01L 23/52* (2006.01)
*H01L 21/44* (2006.01)
(52) U.S. Cl. .................. 257/750; 438/675
(58) Field of Classification Search ......... 438/129, 438/599, 652, 675; 257/700, 752
See application file for complete search history.

(56) References Cited

U.S. PATENT DOCUMENTS 6,150,261 A * 11/2000 Hsu et al. ............. 438/640

| 2002/0168827 | A1* | 11/2002 | Saikawa et al. ............ 438/301 |
| 2003/0178664 | A1 | 9/2003 | Kuo et al. |
| 2003/0194842 | A1 | 10/2003 | Kuo et al. |
| 2004/0026732 | A1 | 2/2004 | Kuo et al. |
| 2004/0105321 | A1 | 6/2004 | Kuo et al. |
| 2005/0205969 | A1 | 9/2005 | Ono et al. |

FOREIGN PATENT DOCUMENTS

| JP | 06224420 | 8/1994 |
| JP | 2002222881 | 8/2002 |

* cited by examiner

*Primary Examiner*—Calvin Lee
(74) *Attorney, Agent, or Firm*—Dicke, Billig & Czaja, PLLC

(57) ABSTRACT

A process of manufacturing a semiconductor circuit includes providing a substrate layer, forming a metal layer above the substrate layer, incorporating circuit components in the substrate layer, and electrically connecting the circuit components to the metal layer. The process includes configuring the circuit components to perform an electrical function of the semiconductor circuit. The semiconductor circuit has a specific electrical conductivity between the substrate layer and the metal layer based on the electrical function performed. The process includes increasing the electrical conductivity between the substrate layer and the metal layer compared with the specific electrical conductivity.

9 Claims, 3 Drawing Sheets

MANUFACTURING SEMICONDUCTOR CIRCUIT, CORRESPONDING SEMICONDUCTOR CIRCUIT, AND ASSOCIATED DESIGN PROCESS

CROSS-REFERENCE TO RELATED APPLICATIONS

This Utility Patent Application claims priority to German Patent Application No. DE 10 2005 049 793.4, filed on Oct. 18, 2005, which is incorporated herein by reference.

BACKGROUND

In the manufacture of present-day semiconductor circuits, plasma is typically used directly for treating the conductive layers of the semiconductor circuit. As illustrated in FIG. 1, a charging current 1 generated via the plasma can cause major problems. This charging current 1 is collected directly in printed conductors 2 incorporated in metal layers of the semiconductor circuit and then dissipated via connections 3 to these printed conductors by circuit structures of the semiconductor circuit, while, because of a F-N-tunnel effect, an electrical current 4 forms through the gate oxide in the substrate layer of the semiconductor circuit. If this electrical current 4 through the gate oxide exceeds a certain threshold value, the associated circuit structure (e.g., a transistor) of the semiconductor circuit, and thus the semiconductor circuit itself, is damaged.

Since the printed conductor 2 functions like an antenna, by collecting the charging current 1 generated via the plasma, this effect is also referred to as antenna effect. Measures to protect against this antenna effect are referred to herein as antenna protection. Design rules, which should be adhered to, in order to avoid damage of the semiconductor circuit because of the antenna effect are referred to herein as antenna rules. The antenna rules basically dictate what ratio between an antenna surface area and a gate surface area of a gate of a transistor of the semiconductor circuit should not be exceeded. The antenna surface area comprises the surface area of the printed conductors connected with the corresponding gate.

Due to the increasing miniaturization of the structures of present-day semiconductor circuits and because of the increasingly larger combinational circuits in proportion to the dimensions of these structures, the antenna rules and other design rules are becoming increasingly more restrictive, as a result of which the design of semiconductor circuits or the design freedom in the design of semiconductor circuits is becoming increasingly more restricted.

For these and other reasons, there is a need for the present invention.

SUMMARY

One embodiment provides a process of manufacturing a semiconductor circuit. The process includes providing a substrate layer, forming a metal layer above the substrate layer, incorporating circuit components in the substrate layer, and electrically connecting the circuit components to the metal layer. The process includes configuring the circuit components to perform an electrical function of the semiconductor circuit. The semiconductor circuit has a specific electrical conductivity between the substrate layer and the metal layer based on the electrical function performed. The process includes increasing the electrical conductivity between the substrate layer and the metal layer compared with the specific electrical conductivity.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
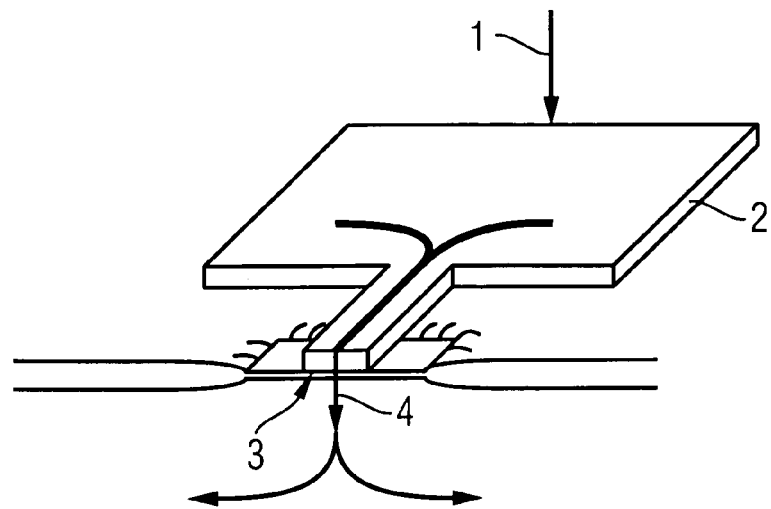
FIG. 1 illustrates propagation of a charging current generated via a plasma within a conventional semiconductor circuit.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of a process for manufacturing a semiconductor circuit and embodiments of a correspondingly manufactured semiconductor circuit, can reduce the consequences of an antenna effect in the manufacture of the semiconductor circuit. Furthermore, embodiments of an associated design process can ease design restrictions to avoid damage to the circuit structures of the semiconductor circuit because of the antenna effect.

One embodiment of a process includes manufacturing a semiconductor circuit with a substrate layer and with a metal layer arranged above the substrate layer. Circuit components or circuit structures (e.g., transistors or diodes) of the semiconductor circuit are incorporated in the substrate layer, via which the semiconductor circuit performs its electrical function. These circuit structures are connected via electrical connections to printed conductors incorporated in the metal layer. Thus, one embodiment of a semiconductor circuit, based on these electrical connections, has a specific conductivity between the substrate layer and the metal layer. The electrical conductivity between the substrate layer and the metal layer is now increased in this embodiment compared with this specific electrical conductivity.

One problem with conventional manufacturing processes of conventional semiconductor circuits is that a charging current generated via a plasma used in the manufacturing process, because of the low conductivity between the metal layer and the substrate layer, can only dissipate via electrical connections between the metal layer and the circuit structures incorporated in the substrate layer. Embodiments increase the conductivity between the substrate layer and the metal layer with these embodiments, the proportion of the charging current which dissipates during manufacture of the semiconductor circuit through the circuit structures incorporated in the substrate layer is reduced. In this way, the antenna rules can be correspondingly relaxed so that the design of a semiconductor circuit is advantageously less restrictive.

According to one embodiment, the electrical conductivity between the substrate layer and the metal layer is increased by electrical connections, which are arranged between the metal layer and areas of the substrate layer, wherein these areas have no circuit structures (e.g., transistors) to perform the electrical function of the semiconductor circuit. The electrical function of the semiconductor circuit is understood herein to be the electrical function which the semiconductor circuit performs. This means that the electrical function indicates with which output values of the semiconductor circuit the semiconductor reacts to certain input values of the semiconductor circuit, wherein the operating time is a component of the electrical function.

Since in one embodiment the electrical connections, which also connect the metal layer and the substrate layer, are only connected with areas of the substrate layer which have no circuit structures for performing the electrical function, the electrical function is in an advantageous manner not affected by these electrical connections. Instead, these electrical connections provide additional discharge paths, so that the charging current generated via the plasma during manufacture of the semiconductor circuit is dissipated.

According to one embodiment, the electrical connections are in particular additional contact holes between the substrate layer and the metal layer. In one embodiment, these additional contact holes are filled with an electrically conducting material, in particular a tungsten alloy, and exist in addition to contact holes which are present in order to connect the circuit components present in the substrate layer to perform the electrical function of the semiconductor circuit with the metal layer.

In one embodiment, it is advantageous for each additional contact hole to be electrically connected with a non-insulating filler structure or dummy structure in the substrate layer. These non-insulating filler structures are incorporated in the substrate layer in order to facilitate the semiconductor circuit manufacturing process.

In one embodiment, in the metal layer, in particular each additional contact hole is in each case connected with an electrically conducting filler structure or dummy structure. These electrically conducting filler structures in the metal layer are incorporated in order to facilitate the chemical-mechanical manufacturing (CMP) of the metal layers of the semiconductor circuit. In one embodiment, the non-insulating filler structures in the substrate layer and the electrically conducting filler structures in the metal layer are arranged one above the other.

Non-insulating filler structures are conventionally incorporated in a substrate layer and electrically conducting filler structures are conventionally incorporated in a metal layer, in order to make the manufacturing process easier or to actually make it possible. Therefore, the incorporation of the additional contact holes according to embodiments, which connect these filler structures, leads in an advantageous manner to electrical connections between the top of the metal layer and the bottom of the substrate layer, which compared to other connections between the top of the metal layer and the bottom of the substrate layer have lower electrical resistance. As a result, in embodiments these electrical connections are in a very good position to dissipate the charging current caused by the plasma, for example to a plate which is, for example, part of a chamber in which the wafer of the semiconductor circuit is etched and on which the wafer rests.

One embodiment of a semiconductor circuit has a conductivity between a metal layer and a substrate layer of the semiconductor circuit which is a higher conductivity than the conductivity resulting from electrical connections between the metal layer and circuit structures incorporated in the substrate for performing the electrical function of the semiconductor circuit. In one embodiment particular areas between the substrate layer and the metal layer, which because of the electrical function of the semiconductor circuit have no electrically conducting connections, are equipped with electrically conducting elements, in order to increase the electrical conductivity between the metal layer and the substrate layer.

Embodiments of a semiconductor circuit have advantages corresponding to those explained above for the embodiments of a process of manufacturing a semiconductor circuit.

One embodiment of a process for designing a semiconductor circuit designs the semiconductor circuit with a substrate layer and a metal layer, which is arranged above the substrate layer. One embodiment of the design process also includes an increase in the electrical conductivity between the substrate layer and the metal layer in areas in which, due to the electrical function of the semiconductor circuit, only a low conductivity exists.

In one embodiment of this design process, the antenna rules, to which a user of the design process adheres, are less restrictive than is the case with conventional design processes. This is possible because this embodiment of the design process automatically increases the electrical conductivity between the substrate layer and the metal layer, as a result of which less charging current flows through the circuit structures incorporated in the substrate layer during manufacture of the semiconductor circuit, than would be the case without the increase in the electrical conductivity between the substrate layer and the metal layer.

One embodiment of a computer program product with a computer program runs on a computer system and executes the above embodiment of the design process. According to one embodiment, an electronically readable data carrier stores electronically readable control information. If this control information is fed into a computer system, by the data carrier being read by the computer system, this control information executes the above embodiment of the design process.

Embodiments are suited for use in the manufacture of microelectronic circuits, wherein a plasma is used which causes a charging current to be generated, which has to be dissipated via the substrate layer of the semiconductor circuit. Naturally, however, the embodiments are not restricted to this area of application, but can, for example, be used in order to dissipate any charging current via the substrate layer.

In the following, more detailed explanations will be made with reference to the accompanying figures.

Figure 2A:
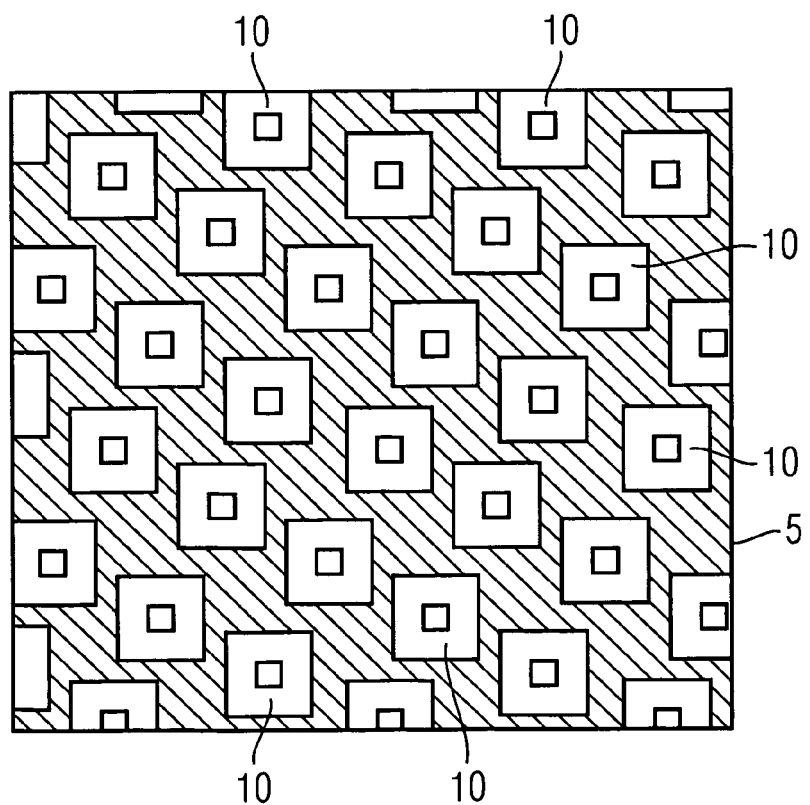
FIG. 2A illustrates a first metal layer of one embodiment of a semiconductor circuit.
Figure 2B:
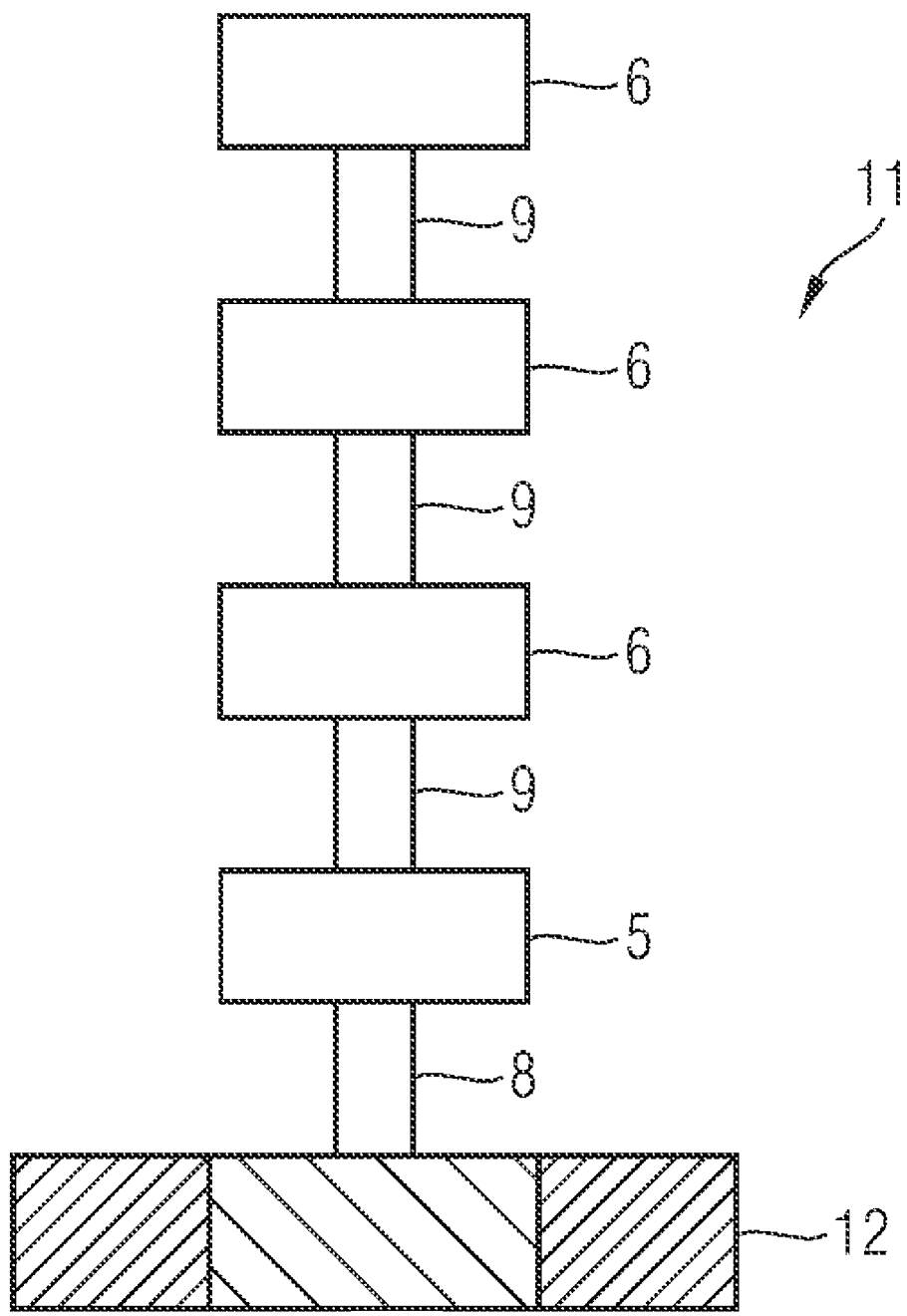
FIG. 2B illustrates one embodiment of a semiconductor circuit in cross-section.

In FIG. 2B a semiconductor circuit 11 according to one embodiment is illustrated in cross-section. Semiconductor circuit 11 comprises a substrate layer 12 and a metal layer 5 arranged directly above substrate layer 12. Three further metal layers 6 are arranged above metal layer 5. While the metal layers 5, 6 are connected together with vias, the first metal layer 5 and the substrate layer 12 are electrically connected by means of contact holes.

FIGS. 2A-2B illustrates one embodiment of a section of the first metal layer 5, in which no printed conductors run. For reasons associated with the manufacturing process in such sections of the metal layers 5, 6, which do not carry any printed conductors, electrically conducting filler structures 10 are arranged at regular intervals. In this embodiment, the electrically conducting filler structures in all the metal layers 5, 6 are arranged oriented one above each other and in each case connected by means of corresponding vias. In the substrate layer 12, oriented below each electrical conducting filler structure 10, in each case a non-insulating filler structure is arranged. By means of contact holes, which are filled with a tungsten alloy, the electrically conducting filler structures 10 of the first metal layer 5 are connected with the non-insulating filler structures of the substrate layer 12.

Thus, in one embodiment, from the outer side of the top metal layer 6 to the under side of the substrate layer 12 there is a plurality of electrically conducting connections, which in each case run via the electrically conducting filler structures 10 in the metal layers 5, 6 and the vias arranged in between as well as a contact hole and an associated non-insulating filler structure. In one embodiment, when producing the semiconductor circuit 11, a majority of the electrical charging current induced by the plasma used during manufacture can be dissipated by means of these electrically conducting connections, so that the proportion of the charging current which flows through the gate oxide of circuit structures of the semiconductor circuit 11 is lower than if the additionally incorporated electrically conducting contacts did not exist.

The advantage due to these additional electrically conducting connections according to embodiments is all the greater, the fewer circuit structures there are incorporated on a wafer or on a semiconductor circuit. The reason for this is that the fewer circuit structures that are present on the wafer or the semiconductor circuit, the higher is the proportion of the wafer or the semiconductor circuit in which the additional contact holes between the first metal layer 5 and the substrate layer 12 are incorporated. In turn, the higher this proportion is, the smaller is the proportion of the charging current which during the manufacture of the semiconductor circuit flows through the circuit structures on the wafer or the semiconductor circuit.

A further advantage of embodiments is that the loading of the individual circuit structures is less dependent upon the proportion of the wafer or the semiconductor circuit which has circuit structures. Thus, in one embodiment of a design process a ratio between a surface area of the semiconductor circuit which has circuit structures and a surface area of the semiconductor circuit which does not have any circuit structures, is less significant than in conventional design processes. This advantage is particularly important in the manufacture of test circuits which sometimes have only a small proportion with circuit structures.

Figure 3:
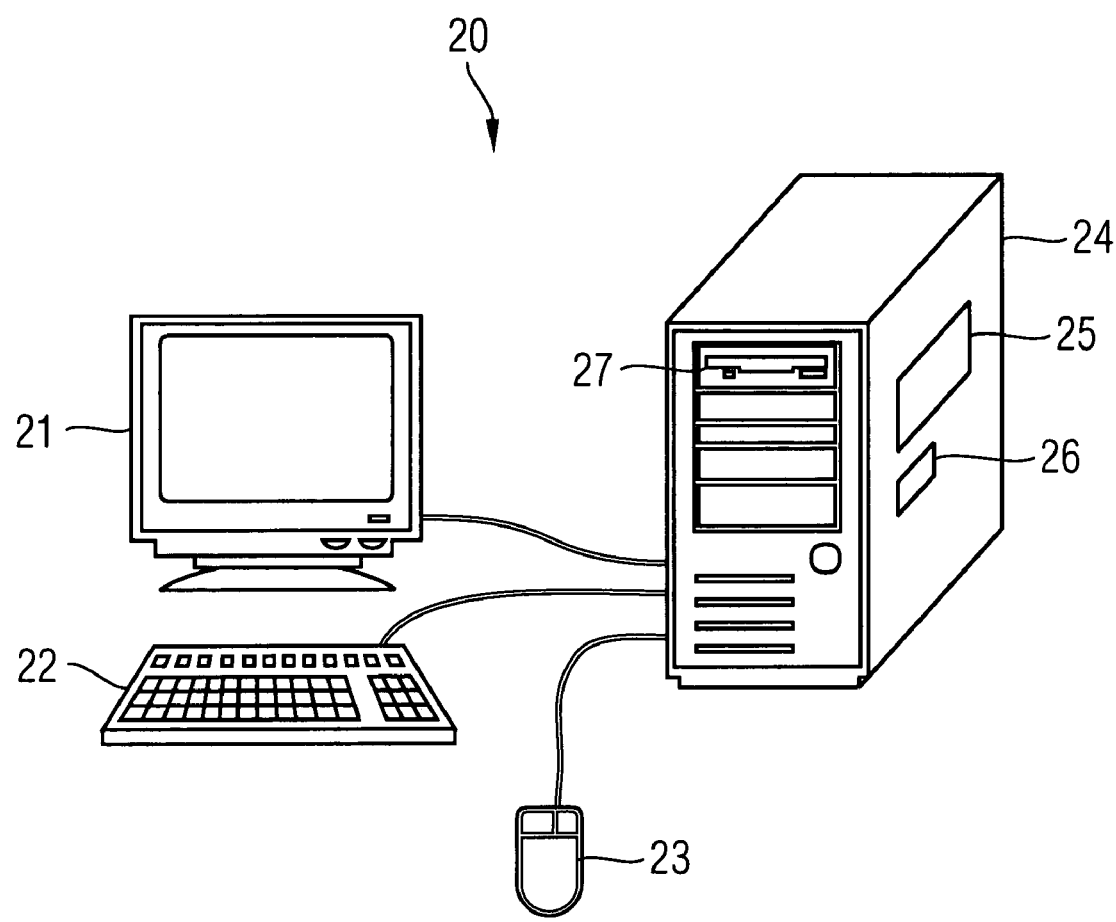
FIG. 3 illustrates one embodiment of a computer system, on which one embodiment of a design process for a semiconductor circuit can be run.

FIG. 3 illustrates one embodiment of a computer system 20, on which one embodiment of a process for designing a semiconductor circuit runs, with which one embodiment of a semiconductor circuit 11 can be designed, which has the additionally incorporated electrically conducting connections as described above. In this embodiment, the computer system 20 comprises a monitor 21, a keyboard 22, a mouse 23 and a computer 24. The computer 24, in turn, comprises a storage medium 25 (e.g., a hard disk), a CPU 26, and a reading device for CD or DVD 27.

In one embodiment, the instructions and information for designing the semiconductor circuit and a computer program provided for executing the design process described above are stored in the storage medium 25 with, for example, input to the computer system 20 taking place via the mouse 23 and the keyboard 22. In one embodiment, computer system 20 carries out the design process described above automatically under software control by accessing the information and/or instructions stored on the storage medium 25.

In one embodiment, electronically readable control information is stored on a DVD 27 (e.g., on an electronically readable data carrier or computer readable medium). If DVD 27 is inserted in the computer system 20 this control information can be read electronically by the computer system 20, by means of which, through the control information, the design process described above is executed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor circuit comprising:
   a substrate layer;
   a metal layer arranged above the substrate layer;
   means incorporated in the substrate layer for performing an electrical function of the semiconductor circuit, wherein the semiconductor circuit has a specific electrical conductivity between the substrate layer and the metal layer based on the electrical function; and
   means for increasing the electrical conductivity between the substrate layer and the metal layer compared with the specific electrical conductivity.

2. A semiconductor circuit comprising:
   a substrate layer;
   a metal layer arranged above the substrate layer;
   circuit components incorporated in the substrate layer, and electrically connected with the metal layer, wherein the circuit components are configured to perform an electrical function of the semiconductor circuit; and
   electrical connections between the metal layer and selected areas of the substrate layer, wherein none of the circuit components are located in the selected areas of the substrate layer.

3. A semiconductor circuit comprising:
   a substrate layer;
   a metal layer arranged above the substrate layer;
   circuit components incorporated in the substrate layer, and electrically connected with the metal layer, wherein the circuit components are configured to perform an electrical function of the semiconductor circuit, wherein the semiconductor circuit has a specific electrical conductivity between the substrate layer and the metal layer based on the electrical function; and
   electrically conducting elements located in selected areas between the substrate layer and the metal layer, wherein the selected areas do not comprise any electrical conducting connections as a result of the electrical function of the semiconductor circuit, wherein the electrically conducting elements are configured to increase the electrical conductivity between the substrate layer and the metal layer compared with the specific conductivity.

4. The semiconductor circuit according to claim 3, wherein the electrically conducting elements comprise contact holes filled with an electrically conducting material, which connect the metal layer with the substrate layer.

5. The semiconductor circuit according to claim 4, wherein the electrically conducting material comprises tungsten.

6. The semiconductor circuit according to claim 3, comprising:
   non-insulating filler structures arranged in the substrate layer to facilitate the manufacture of the semiconductor circuit, wherein each electrically conducting element is connected with a non-insulating filler structure.

7. The semiconductor circuit according to claim 3, comprising:
   electrically conducting filler structures arranged in the metal layer to facilitate the manufacture of the semiconductor circuit, wherein each electrically conducting element is electrically connected with an electrically conducting filler structure.

8. The semiconductor circuit according to claim 7, comprising:
   additional metal layers arranged above the metal layer; and
   electrically conducting filler structures arranged within the additional metal layers.

9. The semiconductor circuit according to claim 8, comprising:
   vias configured to connect the electrically conducting filler structures of the additional metal layers and the metal layer.

* * * * *